(12) United States Patent
Park

(10) Patent No.: US 6,689,637 B2
(45) Date of Patent: Feb. 10, 2004

(54) METHOD OF MANUFACTURING A MULTI-CHIP SEMICONDUCTOR PACKAGE

(75) Inventor: Kye Chan Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/167,558

(22) Filed: Jun. 12, 2002

(65) Prior Publication Data

US 2002/0192869 A1 Dec. 19, 2002

(30) Foreign Application Priority Data

Jun. 15, 2001 (KR) .......................................... 2001-33944

(51) Int. Cl.⁷ .......................... H01L 21/44; H01L 21/48; H01L 21/50

(52) U.S. Cl. ........................................ 438/118; 438/127

(58) Field of Search ................................ 438/118, 107, 438/127, 123, 124

(56) References Cited

U.S. PATENT DOCUMENTS

| | | |
|---|---|---|
| 5,786,230 A | 7/1998 | Anderson et al. |
| 6,121,682 A | 9/2000 | Kim |
| 6,365,432 B1 | 4/2002 | Fukutomi et al. |

*Primary Examiner*—Richard Elms
*Assistant Examiner*—Beth E. Owens
(74) *Attorney, Agent, or Firm*—Timothy J. Keefer; Wildman, Harrold, Allen & Dixon LLP

(57) ABSTRACT

A method of fabricating a semiconductor package capable of realizing a smaller and more compact size and improving reliability of package product and a fabrication method thereof. A main semiconductor chip operates as a lead frame or a substrate and having a plurality of main chip pads on the outer peripheral part thereof; one or more sub semiconductor chips adhered to a predetermined part of the main semiconductor chip and having a plurality of sub chip pads on the outer peripheral part thereof; an insulating layer formed on the main semiconductor chip in a shape surrounding the sub semiconductor chip to expose the main chip pads and the sub chip pads; a plurality of metal patterns electrically connecting the exposed main chip pad to the sub chip pad or one sub chip pad to another sub chip pad; and a plurality of solder lands formed on a predetermined part of the plurality of metal patterns.

9 Claims, 5 Drawing Sheets

METHOD OF MANUFACTURING A MULTI-CHIP SEMICONDUCTOR PACKAGE

CROSS REFERENCE TO RELATED APPLICATION

This application claims the priority of Korean patent application Serial No. 2001-33944 filed on Jun. 15, 2001.

BACKGROUND OF THE INVENTION

1. Field of the Invention

The present invention relates to a semiconductor package and, more particularly to a milti-semiconductor package comprising a plurality of semiconductor chips and a fabrication method thereof.

2. Description of the Prior Arts

Recently, electronic apparatuses using semiconductor chips (semiconductor device), for example computer, PCS, cellular phone and PDA, have become of high performance, simpler to fabricate and smaller and more compact in the size. Accordingly, semiconductor chips and semiconductor packages applied to the electronic system also become smaller and more compact.

As is generally known, package methods of semiconductor chips include Multi Chip Module (MCM) package and Multi Chip Package (MCP).

As shown in FIG. 3, the MCM package is fabricated by a method in which a plurality of semiconductor chips 302, 304 and 306 are adhered on a base 300 such as a thin metal film, ceramic or substrate using wire bonding, tape bonding and flip chip bonding.

In FIG. 3, the first semiconductor chip 302 is adhered by wire bonding, the second semiconductor chip 304 is adhered by tape bonding and the third semiconductor chip 306 is adhered by flip chip bonding, wherein a reference numeral 308 represents a PGA input/output terminal and 310 represents a BGA input/output terminal.

The MCP is fabricated by a method in which two or more semiconductor chips are mounted in a package of defined size, wherein a plurality of semiconductor chips are mounted on a lead frame or substrate using wire bonding. Referring to FIG. 4, a plurality of semiconductor chips 404a and 404b are loaded on a substrate 402 using wire bonding and pads of the semiconductor chips 404a and 404b are connected to an external lead 406 by using wire 408, wherein the resulting structure is surrounded by epoxy molding compound (EMC) 400.

However, the conventional MCM package and the MCP have limitations in realizing a small and compact size due to the structure that a plurality of semiconductor chips are adhered on a base such as a thin metal film, ceramic or substrate using wire bonding, tape bonding or a flip chip bonding, or that a plurality of semiconductor chips are mounted on a substrate using wire bonding and then, surrounded by epoxy molding compound.

And, the conventional package has a structure that a pad of semiconductor chip and the external lead are connected by wire, thereby there arises a problem of lowering the quality and reliability of semiconductor package (that is, degradation of electrical properties) and especially, the conventional package using EMC has a problem that reliability of semiconductor package is lowered drastically by alpha particles generated in the epoxy molding compound (EMC) and pollution in active region of device by EMC.

SUMMARY OF THE INVENTION

Therefore, the present invention has been proposed to solve the above problems and the primary objective of the present invention is to provide a semiconductor package capable of realizing a small and compact size and improving the reliability and the fabrication method of the same.

The semiconductor package of the present invention comprises: a main semiconductor chip operating as a lead frame or a substrate and having a plurality of main chip pads on the outer peripheral part thereof; one or more sub semiconductor chips adhered to a predetermined part of the main semiconductor chip and having a plurality of sub chip pads on the outer peripheral part thereof; an insulating layer formed on the main semiconductor chip in a shape surrounding the sub semiconductor chip to expose the main chip pads and the sub chip pads; a plurality of metal patterns electrically connecting the exposed main chip pad to the sub chip pad or one sub chip pad to another sub chip pad, each metal pattern comprising a lower barrier layer formed on the main chip pad, a seed layer formed on the lower barrier layer, and a metal layer formed on the seed layer; and a plurality of solder lands formed on a predetermined part of the plurality of metal patterns.

The method of fabricating the semiconductor package according to the present invention comprises the steps of: applying an adhesive on a predetermined part of main semiconductor chip operating as a lead frame or a substrate and having a plurality of main chip pads on the outer peripheral part thereof; adhering one or more sub semiconductor chips having a plurality of sub chip pads on the outer peripheral thereof on the adhesive; forming an insulating layer to surround the one or more sub semiconductor chips and to expose the main chip pads and the sub chip pads; forming a plurality of metal patterns electrically connecting the main chip pad to the sub chip pad and one sub chip pad to another sub chip pad; applying a sealant on the entire surface of the main semiconductor chip having the plurality of metal patterns and then exposing the upper part of the metal pattern; forming a solder land on the exposed upper part of metal pattern; and adhering a solder ball on the upper part of the solder land.

DETAILED DESCRIPTION OF THE INVENTION

The objects and features of the invention may be understood with reference to the following detailed description of an illustrative embodiment of the invention, taken together with the accompanying drawings.

FIGS. 1A to 1K are drawings showing a process of fabricating a semiconductor package according to the present invention.

Figure 1A:
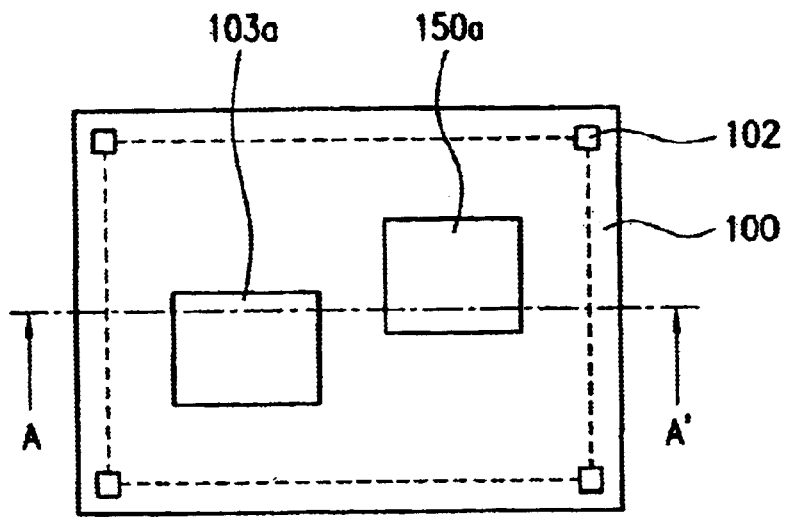
FIGS. 1A to 1K are drawings showing a process of fabricating a semiconductor package according to the present invention.

Referring to FIG. 1A, adhesives 130a and 150a are applied to adhere sub semiconductor chips 130 and 150 (refer to FIG. 1C) on a predetermined part of main semiconductor chip 100 operating as a lead frame or a substrate and having a plurality of main chip pads 102 on the outer side thereof. The adhesives 130a and 150a are made of resin curing at a temperature of over 175° C. for 5 to 30 minutes. Practically, it is desirable to employ a nonconductive polymer having a good thermal dispersion ability. The thickness of the adhesive is preferably below 1 mil.

The main semiconductor chip and the sub semiconductor chip may be microprocessor and memory, microprocessor and nonmemory, or memory and nonmemory.

Figure 1B:
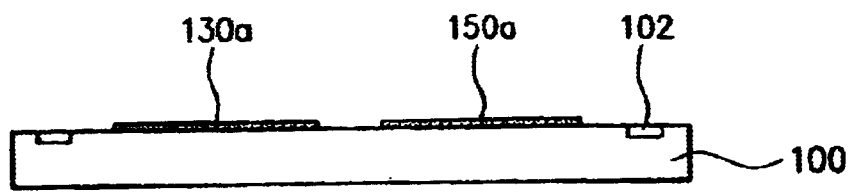

FIG. 1B is a cross-sectional view taken along the line A–A' of FIG. 1A.

Figure 1C:
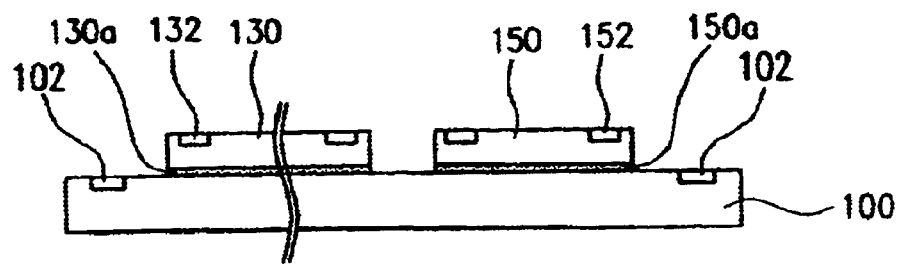

Referring to FIG. 1C, sub semiconductor chips 130 and 150 having a plurality of sub chip pads 132 and 152 are adhered on the adhesives 130a and 150a applied on a predetermined position of the main semiconductor chip 100, wherein the sub semiconductor chips 130 and 150 have a size smaller than that of the main semiconductor chip 100 and the thickness of main semiconductor chip may be in the range of 5 to 30 mil and that of sub semiconductor chips 130 and 150 may be below 1 mil.

And, the main chip pad 102 on the main semiconductor chip 100 and the sub chip pads 132 and 152 on the sub semiconductor chips 130 and 150 have a size of 25 to 150 $\mu$m.

Figure 1D:
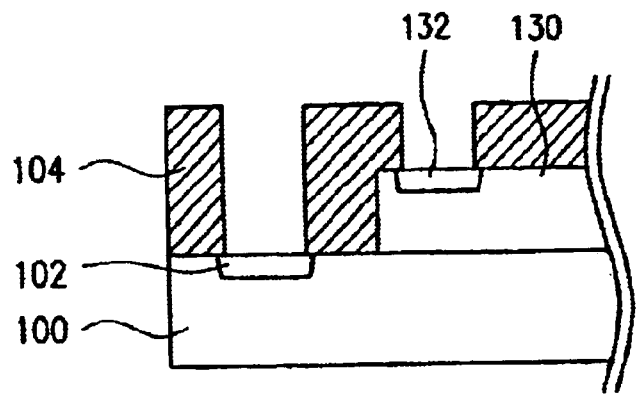

Subsequently, an insulating layer 104 such as a resin is formed to completely cover the sub semiconductor chips 130 and 150 on the main semiconductor chip 100 and then, partially etched in accordance with an etch process using a mask pattern, thereby exposing the upper part of main chip pad 102 on the main semiconductor chip 100 and the sub chip pad 132 on the sub semiconductor chip 130 as shown in FIG. 1D. The insulating layer 104 may be made of nonconductive polyimide or polymer.

Figure 1E:
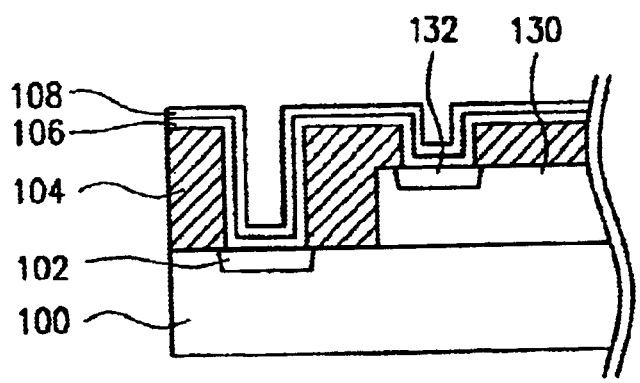

Then, sputtering or evaporation process is performed to sequentially form a lower barrier layer 106 of Ti/W and a seed layer 108 of pure copper on the entire surface of the main semiconductor chip 100 as shown in FIG. 1E. The lower barrier layer 106 is formed to prevent diffusion and to increase adhesive power.

Figure 1F:
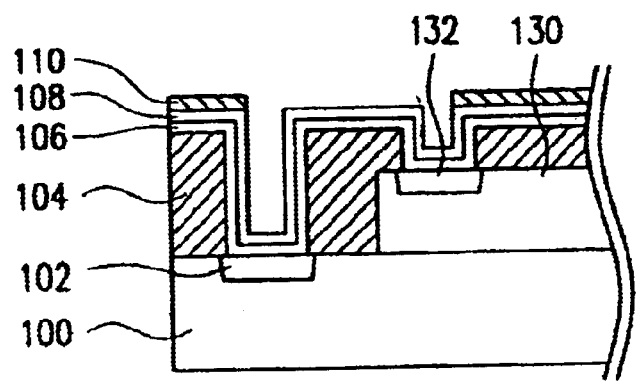

Subsequently, a photoresist is applied on the entire surface of the main semiconductor chip 100 and exposure and development processes are performed, thereby forming a photoresist pattern 110 on the main semiconductor chip 100. Referring to FIG. 1F, the photoresist pattern 110 has a shape exposing the main chip pad 102 of main semiconductor chip 100, the sub chip pad 132 of sub semiconductor chip 130 and the metal pattern connecting the pads.

Figure 1G:
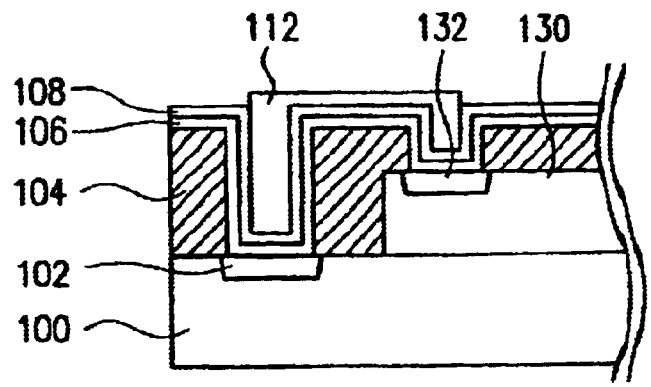

Referring to FIG. 1G, on the exposed regions not having formed the photoresist pattern 110, that is, on the main chip pad 102 of main semiconductor chip 100, the sub chip pad 132 of the sub semiconductor chip 130 and the connecting part therebetween a metal material having a good electrical conductivity (for example, copper and gold) is formed to the height of the photoresist pattern 110. And then, a strip process is performed to remove the photoresist pattern 110, thereby forming a metal layer 112 electrically connecting the main chip pad 102 and the sub chip pad 132 on the seed layer 108.

Figure 1H:
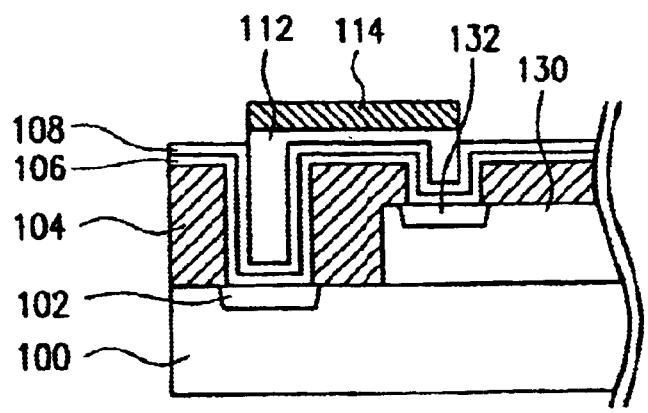

Next, a photoresist is applied on the entire surface of the main semiconductor chip 100 and exposure and development processes are performed to form a mask pattern 114 on the main semiconductor chip 100. Referring to FIG. 1H, the mask pattern 114 is formed to cover only the upper part of the metal layer 112.

Figure 1I:
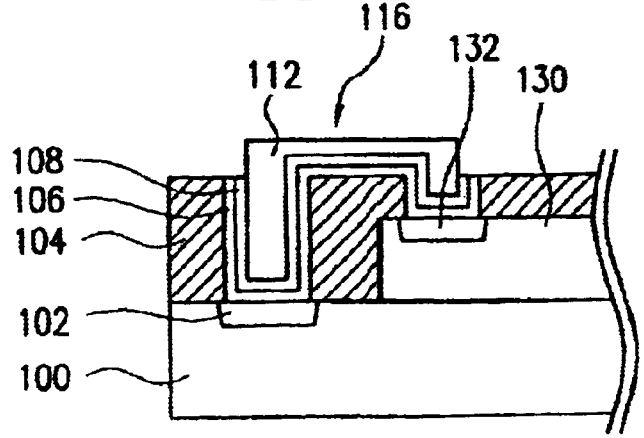

Subsequently, an etch process is performed by using the mask pattern 114 as an etch mask to selectively etch the remaining regions except the seed layer 108 and the lower barrier layer 106 formed on the lower part of the metal layer 112, thereby exposing a part of the insulating layer 104. Thereafter, when the mask pattern 114 is removed in accordance with a strip process, a metal pattern 116 comprising the lower barrier layer 106, the seed layer 108 and the metal layer 112 is formed to electrically connect the main chip pad 102 and the sub chip pad 132 as shown in FIG. 1I. The metal pattern 116 has a width of 25 to 150 $\mu$m and a thickness of 2000 Å to 10 mil.

In this embodiment, the material of metal pattern 116 is described as Ti/W+Cu+Cu or Ti/W+Cu+Au. However, it may be formed of compounds comprising Cr+Ni+Au, Cr+Ni+Au+Cu, Cr+Co+Ni+Au or Cr+Co+Ni+Cu+Au.

Figure 1J:
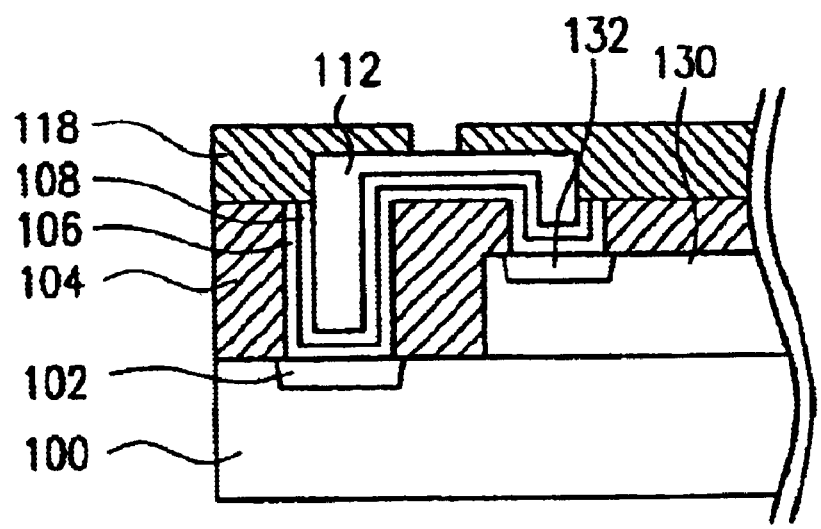

Then, a solder resist 118 is applied as a sealant on the entire surface of the main semiconductor chip 100 having the metal pattern 116 to a predetermined thickness (preferably, 10 to 100 $\mu$m) and a photolithography and an etch processes are performed to selectively expose the upper part of metal pattern 116 as shown in FIG. 1J.

Figure 1K:
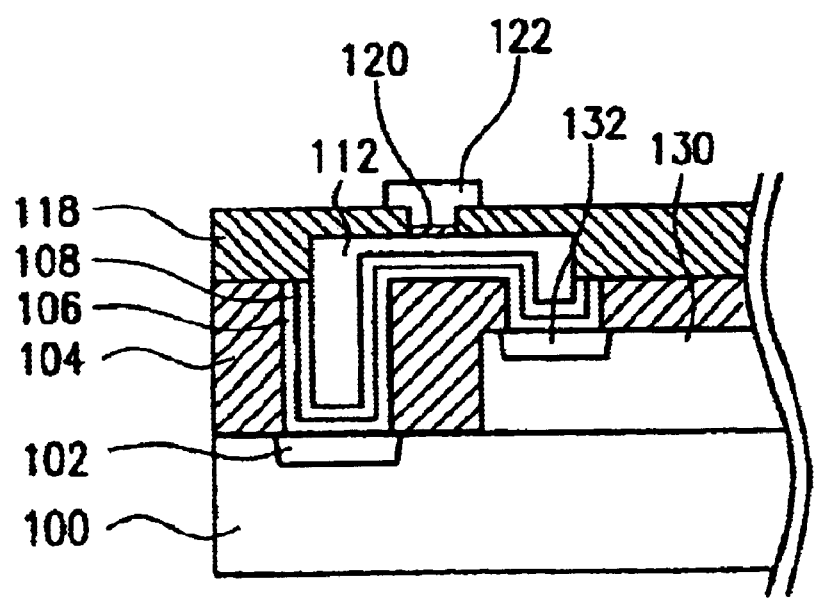

Finally, as shown in FIG. 1K, a solder land 120 is formed on the exposed part of metal pattern 116 to adhere a solder ball 122, thereby completing the fabrication process of semiconductor package. The solder land 120 has a shape of circle or rectangle, wherein the rectangular solder land has a size of 0.1×0.1 mm to 1.5×1.5 mm and the circular one has a diameter of Ø0.1 mm to Ø1.5 mm.

Figure 2:
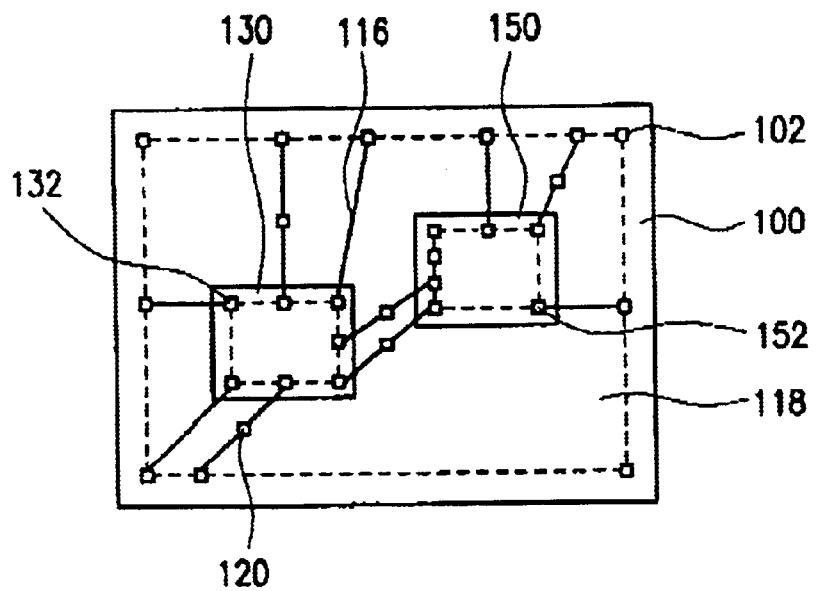
FIG. 2 is a top plan view of semiconductor package according to the present invention.
Figure 3:
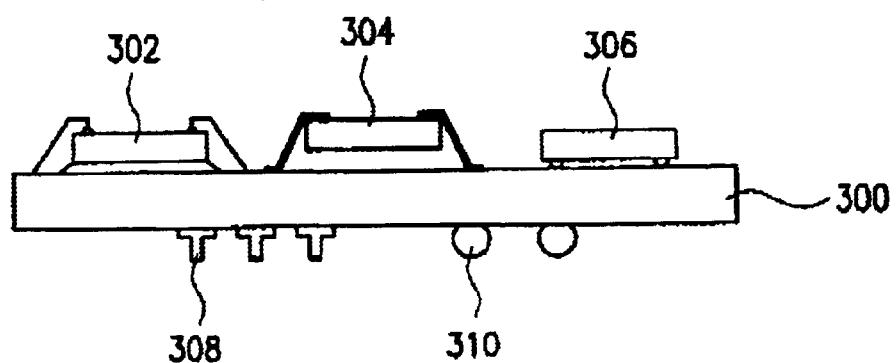
FIG. 3 is a cross-sectional view of conventional Multi Chip Module (MCM) package.
Figure 4:
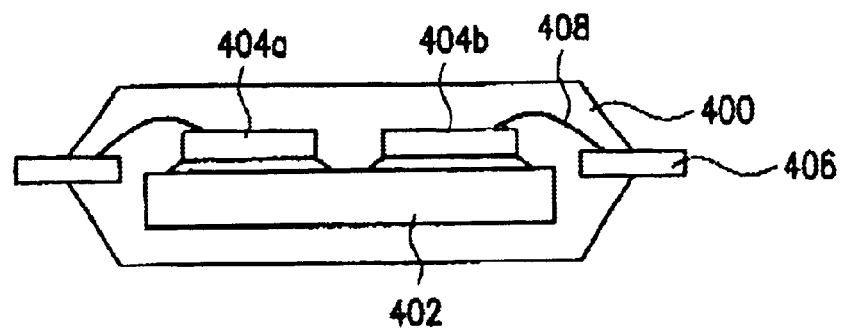
FIG. 4 is a cross-sectional view of conventional Multi Chip Package (MCP).

As shown in FIG. 2, the semiconductor package of the present invention has a structure that sub semiconductor chips 130 and 150 are loaded on the main semiconductor chip 100, and the metal pattern 116 and the solder land 120 electrically connects main chip pads 102 formed on the outer side of the main semiconductor chip 100 to sub chip pads 132 and 152 formed on the outer side of sub semiconductor chips 130 and 150 and sub chip pads 132 and 152 to another sub chip pad, wherein the upper part of semiconductor chip 100 is sealed by the solder resist 118 as a sealant except the metal pattern 116, solder land 120 and the main chip pad 102.

Although it is not shown in the drawing, a solder ball 122 is adhered to the solder land 120 in a later process.

As described above, the present invention has a structure that a plurality of semiconductor Chips are adhered directly on one semiconductor chip operating as a lead frame or a substrate by a metal pattern. Therefore, it is possible to realize smaller and more compact size and to lower the manufacturing cost. Moreover, it has an advantage 1.0 of improving reliability on electrical properties of semiconductor package since semiconductor chips are connected directly by metal pattern.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating a semiconductor package including a plurality of semiconductor chips, which comprises the steps of:

applying an adhesive on a predetermined part of a main semiconductor chip operating as a lead frame or a substrate and having a plurality of main chip pads on an outer peripheral part thereof;

adhering one or more sub semiconductor chips having a plurality of sub chip pads on the outer peripheral part on the adhesive;

forming an insulating layer to surround the one or more sub semiconductor chips and leaving exposed the main chip pads and the sub chip pads;

forming a plurality of metal patterns electrically connecting the main chip pads to the sub chip pads and one sub chip pad to another sub chip pad;

applying a sealant on the entire surface of the main semiconductor chip having the plurality of metal patterns and then exposing the upper part of the metal patterns;

forming solder lands on the exposed upper part of metal patterns; and adhering solder balls on the upper part of the solder land.

2. The method of fabricating the semiconductor package according to claim 1, wherein the adhesive comprises a nonconductive polymer and the thickness of the polymer is below 1 mil.

3. The method of fabricating the semiconductor package according to claim 1, wherein the main chip pad has a size of 25 to 150 μm and a thickness of 5 to 30 mil and the sub chip pad has a size of 25 to 150 μm and a thickness of below 1 mil.

4. The method of fabricating the semiconductor package according to claim 1, wherein the insulating layer comprises a nonconductive polyimide or polymer.

5. The method of fabricating the semiconductor package according to claim 1, wherein the step of forming the metal patterns comprises the steps of:

sequentially forming a lower barrier layer and a seed layer on the entire surface of the main semiconductor chip including the exposed main chip pads and the sub chip pads;

forming a photoresist pattern leaving exposed the regions covered by the seed layer electrically connecting the main chip pads and the sub chip pads;

forming a metal material on the exposed seed layer and removing the photoresist pattern;

forming a mask pattern to expose the remaining regions except the metal material; and performing an etch process using the mask pattern to etch the seed layer and the lower barrier layer to the surface of the insulating layer, and removing the mask pattern.

6. The method of fabricating the semiconductor package according to claim 1, wherein the metal pattern comprises one selected from a group consisting of Ti/W+Cu+Cu, Ti/W+Cu+Au, Cr+Ni+Au+Cu, Cr+Co+Ni+Au and Cr+Co+Ni+Cu+Au.

7. The method of fabricating the semiconductor package according to claim 6, wherein the metal pattern has a width of 25 to 150 μm and the thickness of 2000 Å to 10 mil.

8. The method of fabricating the semiconductor package according to claim 1, wherein the sealant is made of solder resist and the thickness of the solder resist is in the range of 10 to 100 μm.

9. The method of fabricating the semiconductor package according to claim 1, wherein the solder land has a shape of a rectangle or a circle and the size of 0.1×0.1 mm to 1.5×1.5 mm and the diameter of 1.5 mm, respectively.

* * * * *